United States Patent [19]

Ohmi et al.

[11] Patent Number: 5,110,438
[45] Date of Patent: May 5, 1992

[54] REDUCED PRESSURE SURFACE TREATMENT APPARATUS

[75] Inventors: Tadahiro Ohmi, 1-17-301, Komegabukuro 2-chome, Aoba-ku, Sendai-shi, Miyagi-ken 980, Japan; Tadashi Shibata, Sendai; Masaru Umeda, Tokyo, both of Japan

[73] Assignee: Tadahiro Ohmi, Miyagi, Japan

[21] Appl. No.: 536,548

[22] PCT Filed: Jan. 12, 1989

[86] PCT No.: PCT/JP89/00026

§ 371 Date: Jul. 10, 1990

§ 102(e) Date: Jul. 10, 1990

[30] Foreign Application Priority Data

Jan. 13, 1988 [JP] Japan .................... 63-5388

[51] Int. Cl.⁵ .................. H05H 1/46; C23F 4/00
[52] U.S. Cl. ................ 204/298.34; 156/345; 156/643; 204/298.35; 204/192.32
[58] Field of Search .............. 204/298.08, 298.25, 204/298.26, 298.31, 298.34, 298.35, 298.36, 192.32, 192.34, 192.37; 156/345, 643

[56] References Cited

U.S. PATENT DOCUMENTS

| | | | |
|---|---|---|---|
| 3,326,177 | 6/1967 | Taylor | 118/718 |
| 3,699,334 | 10/1972 | Cohen et al. | 250/492.2 |
| 3,728,246 | 4/1973 | Barkhudarov et al. | 204/298.16 |
| 4,399,016 | 8/1983 | Tsukada et al. | 204/192.34 X |
| 4,464,223 | 8/1984 | Gorin | 156/643 |
| 4,585,516 | 4/1986 | Corn et al. | 156/643 |
| 4,863,549 | 9/1989 | Grunwald | 156/345 |
| 4,889,588 | 12/1989 | Fior | 156/643 |
| 4,950,377 | 8/1990 | Huebner | 204/192.32 |
| 5,057,185 | 10/1991 | Thomas, III et al. | 156/643 |

FOREIGN PATENT DOCUMENTS

| | | | |
|---|---|---|---|
| 3733135C1 | 9/1985 | Fed. Rep. of Germany | 204/298.34 |
| 62-97328 | 5/1987 | Japan | 204/298.34 |

Primary Examiner—Aaron Weisstuch
Attorney, Agent, or Firm—Baker & Daniels

[57] ABSTRACT

The reduced pressure surface treatment apparatus according the present invention comprises at least one vacuum chamber and an exhaust unit and a gas supply unit connected thereto, and it is characterized in that it is provided with a holder to hold the specimen, means to bombard the specimen with ions without depositing a thin film on said specimen surface, and means to control kinetic energy of said ions to a small value. The reduced pressure surface treatment method of this invention is characterized in that substances adsorbed on the wafer surface or natural oxide film layers are removed by impinging ions on the wafer surface under a vacuum condition.

3 Claims, 4 Drawing Sheets 5,110,438

REDUCED PRESSURE SURFACE TREATMENT APPARATUS

BACKGROUND OF THE INVENTION

1. Technical Background

The progress of LSI technology is extremely rapid, and the degree of integration is increasing year by year. Taking as an example dynamic random access memory (DRAM), memory capacity has quadrupled in three years. The product development for a 4-megabit DRAM has now been completed, and technical development is now directed to 16-megabit and 64-megabit DRAMs. With the increase in the degree of integration, the dimension of a unit element is minimized, and the minimum dimension is rapidly decreasing from 1 μm to the order of submicron. Various devices and IC's are basically composed of a laminated structure of various types of thin film. For example, the main portion of a MOS transistor is composed of a 3-layer structure comprising electrode material, insulating thin film, and semiconductor substrate. The capacitor used for a memory cell of a DRAM has a 3-layer structure with a high dielectric thin film sandwiched by upper and lower electrode materials. A non-volatile memory element has a 5-layer structure composed of semiconductor substrate, insulating thin film, electrode material, insulating thin film, and electrode material. Thus, the thin film laminated structure dominates the most important characteristics of the device. Because the thickness of these thin films is increasingly becoming thinner with the miniaturization of the device, the characteristics of these thin films are the important factor to determine the characteristics, yield and reliability of the LSI. Therefore, the key point for the realization of ultra-high integration is the technique to form high quality thin films and to produce the laminated structure of thin films with high reliability. Further, this process requires low temperatures instead of the high temperatures of 900°–1000° C. as used at present. For example to produce a capacitor structure using aluminum as a lower electrode, the temperature utilized to form an insulating film and an electrode on it must be lower than the melting point of aluminum (about 630° C.) for instance, 500°–550° C. or less—or more preferably, 400° C. or less. For accurate control of N-type or P-type impurities, it is necessary to reduce the process temperature to 700° C. or less.

In the following, description will be given of the method to produce a conventional type thin film laminated structure, taking as an example the manufacturing process of a DRAM memory cell.

FIG. 7 is a schematic drawing showing the cross sectional structure of a memory capacitor unit 701 of a DRAM memory cell as formed by the conventional technique. To produce this structure, field oxide film 703 is formed on silicon substrate 702, and the surface of silicon substrate 702 of memory capacitor forming portion 701 is exposed. Then, $SiO_2$ film 704 of about 100 Å is formed by thermal oxidation at 900° C. (This $SiO_2$ film acts as a capacitor insulating film.) Thereafter, polycrystal silicon thin film 705 is deposited by a CVD method, and the memory capacitor is produced by patterning it into the predetermined shape. In this process, after the surface of silicon substrate 702 is exposed by etching with dilute HF solution, the wafer is placed into a thermal oxidation furnace to grow the oxide film. After the wafer is taken out of the furnace, it is placed into a CVD apparatus and polycrystal silicon film 705 is deposited, and this is processed to form the predetermined pattern. As a result, the interface of each thin film comes into contact with atmospheric air because each thin film which composes the laminated structure is formed in a separate apparatus in the normal process. For this reason, the interfaces are contaminated by adsorption of contaminants in the atmospheric air, and this results in instability and variation of the isolation voltage or other characteristics of the thin film oxide film. An oxide film of 100 Å thickness is the insulating film to be used for a 1-megabit DRAM. For a 4-megabit or 16-megabit DRAM, it is necessary to have a thin film of 50 Å or thinner, and the problem of interface contamination is an important and serious issue concerning the decrease of isolation voltage or the reliability of the thin film oxide film. In some cases, a silicon nitride film ($Si_3N_4$) thin film having a higher dielectric constant than the thermal oxide film of Si ($SiO_2$) is used as the capacitor insulating film 704 of DRAM. Because it is very difficult to form $Si_3N_4$ film through direct nitriding of silicon $Si_3N_4$ film deposited by a LPCVD method is used. Normally, such thin film formed by depositing has poor characteristics in the interface with silicon and there are more defects such as pinholes. Accordingly, after the silicon surface is processed by thermal oxidation, the characteristics of the interface with Si are improved by depositing a $Si_3N_4$ film, and any pinholes are filled up by thermal oxidation after the $Si_3N_4$ film is deposited.

In such a process, the final capacitor structure is a 5-layer laminated structure composed of Si, $SiO_2$, $Si_3N_4$, $SiO_2$ and poly-Si (polycrystal silicon), and this means that there are four interfaces to be exposed to atmospheric air, and it is very difficult to prevent contamination.

FIG. 8 shows another example of a thin film laminated structure formed by conventional techniques, and it represents the structure of the connection between N+ area 802 formed in P-type semiconductor substrate 801 and metal wiring 803. To obtain this structure, N+ area 802 is formed in wafer (Si substrate) 801, and $SiO_2$ film 804 is formed over the entire surface. Then, an opening 805 is provided in the predetermined portion of $SiO_2$ film 804. Next, Al-Si alloy thin film is formed over the entire surface to a thickness of about 0.8–1 μm, and it is fabricated into the predetermined circuit pattern by a photolithography process. One of the problems with this structure is the electrical contact between metal wiring 803 and N+ area 802. By conventional techniques, N+ area surface 806 is exposed to atmospheric air before the Al-Si thin film is formed after the contact hole 805 is opened, and a very thin natural oxide film is often formed on the surface or gas molecules in the atmospheric air are adsorbed on the surface of N+ surface 806, and this results in poor contact whereby the contact resistance is increased. For this reason, it has been attempted to increase the temperature of the wafer to 400°–450° C. after metal wiring 803 was formed, and the natural oxide film or adsorbed objects were absorbed by the metal wiring 803 in order to attain good metal-semiconductor contact. Specifically, to attain metal-semiconductor contact by the conventional techniques, it was indispensable to perform heat treatment at 400°–450° C. In such a heat treatment process, when the wafer temperature is decreased from a high temperature of 400°–450° C. to normal temperature, Si in Al-Si thin film 803 is deposited at the interface 806, and this resulted in wide variations of contact resistance. Particularly, in a contact opening of 1 μm or less, such Si deposits cover the entire surface of the contact (interface 806) and cause problems such as poor contact. On the other hand, if pure aluminum metal is used as metal wiring 803 instead of an alloy in order to prevent Si deposition, Al is melted into the Si when the temperature is raised to 400°–450° C. It penetrates $N^+$-layer 802, reaches the P-type semiconductor substrate 801 and destroys the PN-junction. Thus, it is very difficult by conventional techniques to have good electrical contact between the metal wiring and the Si substrate.

To realize ultra-high integration in the future, it is very important to develop a technique to produce the laminated structure of very thin films at low temperature and with no possibility to induce contamination at the interface.

To attain such a result, the present invention provides a reduced pressure surface treatment apparatus and a reduced pressure surface treatment method suitable for the manufacture of ultra-high density integrated circuits.

2. Disclosure of the Invention

The present invention offers a reduced pressure surface treatment apparatus, comprising a vacuum chamber, an exhaust unit connected thereto and a gas supply unit, characterized in that it is provided with a holder to hold the specimen, means to bombard the specimen with ions without depositing a thin film on the surface of said specimen, and means to control the kinetic energy of said ions to a small value.

The reduced pressure surface treatment method according to this invention is characterized in that substances adsorbed on a wafer surface or the natural oxide film layer are removed by impinging ions on the wafer surface under a vacuum condition.

BRIEF DESCRIPTION OF THE DRAWINGS

Corresponding reference characters indicate corresponding parts throughout the several views. The exemplification set out herein illustrates one preferred embodiment of the invention, in one form, and such exemplifications are not to be construed as limiting the scope of the invention in any manner.

DESCRIPTION OF THE PREFERRED EMBODIMENT

The embodiments of this invention are now described in connection with the drawings.

Figure 1:
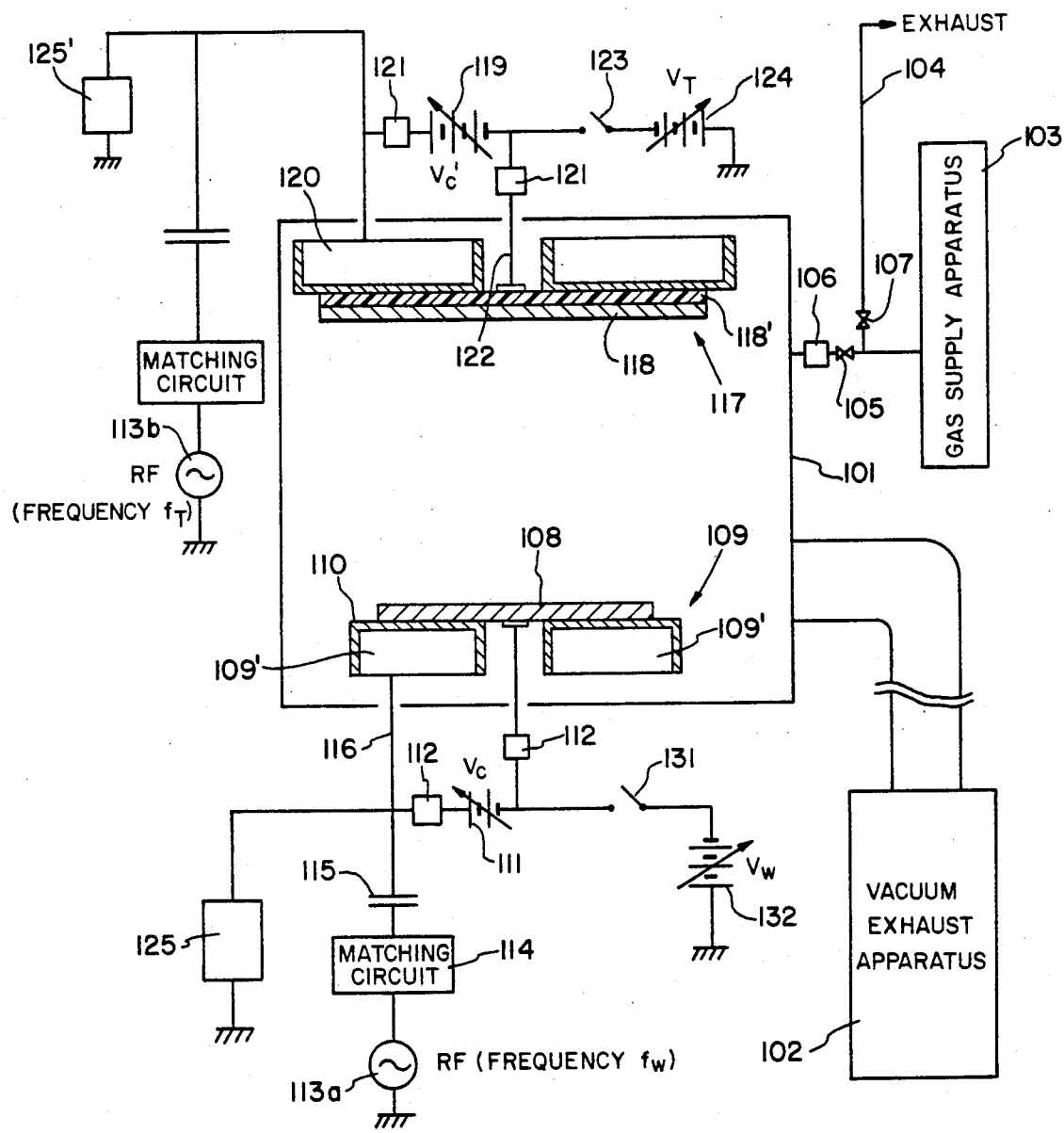
FIG. 1 is a sectional view of an example of the reduced pressure surface treatment apparatus according to an embodiment of the present invention.

FIG. 1 is a schematic sectional view of a reduced pressure surface treatment apparatus which illustrates the first embodiment of this invention.

101 is a vacuum chamber, which is connected to a vacuum exhaust unit 102 and a gas supply unit 103. As the vacuum exhaust unit 102, a turbo molecular pump having a rotor of the magnetic floating type may be used by connecting a rotary pump to it as a backup through an oil trap. Also, by connecting two stages of turbo molecular pumps in series, the attainable degree of vacuum may be increased. When treatment is performed by feeding gas from the gas supply system, a structure may be provided which can be switched over to a dry pump. The gas supply unit 103 can supply Ar, He, $H_2$, etc. to vacuum chamber 101. For example, argon gas is always supplied at a constant flow rate (1–5 liters/min.) and is purged from the system by the purge line 104. Only when treatment is performed in the vacuum chamber 101, valve 105 is opened, and a part of the gas is controlled to a smaller flow rate of 1–10 cc/min. by a m flow controller 106 and is introduced into the vacuum chamber 101. If argon gas is introduced into the vacuum chamber 101 from gas supply unit 103 only when treatment is performed and stopped in other cases, a small quantity of water molecules adsorbed in the inner wall of the gas piping is dissolved into the remaining argon gas and the moisture concentration of the gas is increased. Thus, the effect of surface treatment as described later cannot be obtained. However, if moisture is properly removed from the inner wall of the gas supply piping system, it is not necessary to utilize such method and the above system for introducing gas into vacuum chamber may be adopted only when necessary by closing the valve 107.

Argon gas introduced into the vacuum chamber 101 is adjusted to a pressure of about $10^{-3}$ to $10^{-2}$ Torr by controlling the flow rate and the displacement of vacuum exhaust unit 102, and it is discharged by high frequency power from high frequency power supply 113b.

108 represents a specimen, e.g. a wafer, or more specifically, a silicon wafer, and 109 is an electrostatic chuck to hold the wafer 108 by electrostatic force. Namely, wafer 108 is held on the wafer holder when a DC potential is applied between the wafer 108 and the electrostatic chuck electrode 109' with the insulating film 110 therebetween.

111 is a DC power supply for the electrostatic chuck 109, and applies a DC potential difference Vc between the electrostatic chuck electrode 109' and the wafer 108 through high frequency filter 112, which cuts off high frequency and supplies DC potential only. 113a is a RF power supply having frequency $f_w$ of 100 $MH_2$, and high frequency power is supplied to wafer 108 by a lead wire 116 through a matching circuit 114 and a blocking capacitor 115. By changing the output of this high frequency power supply 113a within the range of several to several tens of watts, the DC potential of wafer 108 can be set to a predetermined value. Or, by changing the matching condition of the matching circuit 114, the DC potential of the wafer can be changed. Even when the wafer surface is covered with an insulating film such as $SiO_2$ film, the DC potential of the surface is approximately the same as the potential of the wafer 108 because the capacitance formed by the $SiO_2$ film is very small compared with the blocking capacitor 115, and self-bias by high frequency appears on both ends of the blocking capacitor 115 in most cases. Therefore, by monitoring the wafer potential with a voltmeter through high frequency filter 112 and by feeding this back to the controller of RF power supply 113a or to the controller of matching circuit 114, the DC potential on the surface of wafer 108 can be accurately controlled to a constant value. With the potential of the wafer 108 thus set, the energy of ions impinging on the wafer surface from the discharge plasma can be accurately controlled to a desired value. On the other hand, because high frequency power of a different frequency $f_T$ (e.g. 210 MHz) is applied to the target 118, the wafer is oscillated by the frequency $f_T$ due to capacitive coupling of the target 118 with the wafer 108. The circuit 125 has a high impedance with respect to the frequency $f_w$ and it short-circuits the high frequency $f_T$. Thus, the DC potential of the wafer is controlled only by the high frequency $f_w$ applied to the wafer holder. For this circuit, an LC parallel resonance circuit is used. When $2\pi f_w = 1/(LC)^{\frac{1}{2}}$, it is open only to the high frequency $f_w$. To the other frequencies, it is short-circuited if C is large enough, and the desired function can be fulfilled. Because a DC potential of a certain degree is generated on wafer holder 109, a capacitor having a sufficiently large capacity is connected with the above LC parallel circuit in series.

$f_T$ must be of a frequency suitable for a gas pressure of to $10^{-3}$ to $10^{-2}$ Torr to attain efficient ionization of the gas. At the same time, it is preferable that it be of a frequency so as not to sputter the target through high DC potential applied to the target 118, e.g. the frequency is preferably 150 MHz or more. However, $f_T$ and $f_w$ must be set in such a manner that they are not in the relation of an integer multiple.

When a conductive thin film is formed on the wafer surface and the thin film is electrically connected to the wafer, the wafer potential may be controlled directly by a DC power supply. In such case, the wafer potential, i.e. the potential on the wafer surface, can be controlled by DC power supply 132 with the switch 131 closed.

117 is a target holder, and the target 118 of $SiO_2$ or $Al_2O_3$ is maintained by the same electrostatic chuck mechanism as wafer holder 109. In this case, conductive material, e.g. metal thin film 118' such as Ti, is provided on the backside because $SiO_2$ and $Al_2O_3$ are insulating materials. The potential between electrostatic chuck electrode 120 and metal thin film 118' is supplied by the DC power supply 119 which is connected through high frequency filter 121. The potential of the target is directly supplied by 122. In the figure, electrical contact is made at the central portion; however it may be kept at the peripheral portion of the target. For DC power supply 119, it is desirable to use a battery as a backup in order to prevent dropping of the target in the case of power loss. For the DC potential of an non-conductive target, the self-bias generated by RF power supply 113b is used. However, when the target is a metal material, it may be effective to connect DC power supply 124 by closing the switch 23 to control the potential. 125' is a circuit having a function similar to that of 125. It is open only to the frequency $f_T$ of RF power supply 113b and is to be grounded to the other frequencies in most cases. However, it is open to DC. Because the power of high frequency power supply 113a (frequency $f_w$) to control the wafer potential is normally low, 125' is not necessarily provided. For power supply 113b, it is preferable to use one with a higher frequency than that of RF power supply 113a connected to the wafer, e.g. 210 MHz. This is to avoid sputtering of the target by decreasing the self-bias generated on the surface of the target 11B. For this reason, a large amount of power is supplied by high frequency power supply 113b and a high density plasma may be generated, while sputtering never occurs on the target 118 and a thin film is never deposited on wafer surface 108. For 118, $Al_2O_3$ or $SiO_2$ having a relatively high sputtering threshold may be used; Si may also be used. However, it is important to adopt a magnetron system for discharging and to set $f_T$ at 150 MHz or more in order to reduce self-bias on the target surface in order to exclude sputtering.

In a magnetron discharge system of 100 MHz with argon gas pressure at $10^{-3}$ to $10^{-2}$ Torr, a self-bias of about $-100V$ occurs on the target, and the target is sputtered to some extent. Namely, plasma density is controlled by the power supply 113b and the rate of argon ion impingement on the wafer is determined by it. The energy of the argon ions impinging on the wafer surface can be controlled by the frequency and electric power of high frequency power supply 113a.

In this way, by bombarding the wafer surface with particles (ions) having low kinetic energy of several to 30 eV (or more preferably, 1 to 5 eV), it is possible to remove the objects adsorbed on the wafer surface (impurity layers, adsorbed water molecule layers) or a very thin natural oxide film layer on the Si surface.

Figure 2:
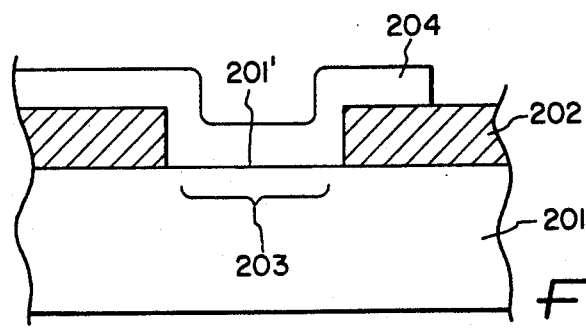
FIG. 2 is a sectional view showing the structure of a Schottky junction formed on a wafer by the apparatus of the present invention.

FIG. 2 is a sectional view showing the structure of a Schottky junction of Cu and Si as prepared by the reduced pressure surface treatment apparatus of the present invention. Specifically, $SiO_2$ film 202 is formed on N-type (100) Si wafer 201, and contact opening 203 was formed. Then, the wafer was placed into the apparatus of FIG. 1. After the surface 201' of Si substrate 201 was bombarded by argon ions having a kinetic energy of 1 to 30 eV for about 10 seconds, it was placed into the sputtering unit, and metal wiring (Cu) 204 was formed on the entire surface. Then, the pattern was formed by a photolithograph technique. These processes were performed at 130° C. or lower for the first time. FIG. 3 shows the current-voltage characteristics of the Schottky junction thus obtained.

Figure 3A:
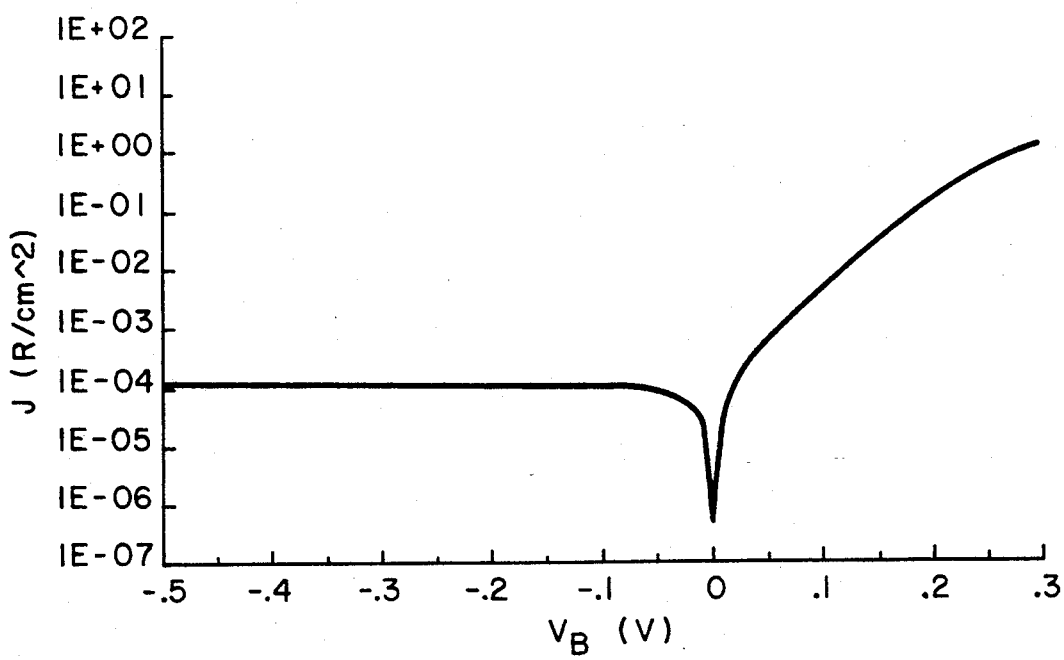
FIGS. 3a and 3b show the current-voltage characteristics of the structure of FIG. 2.
Figure 3B:
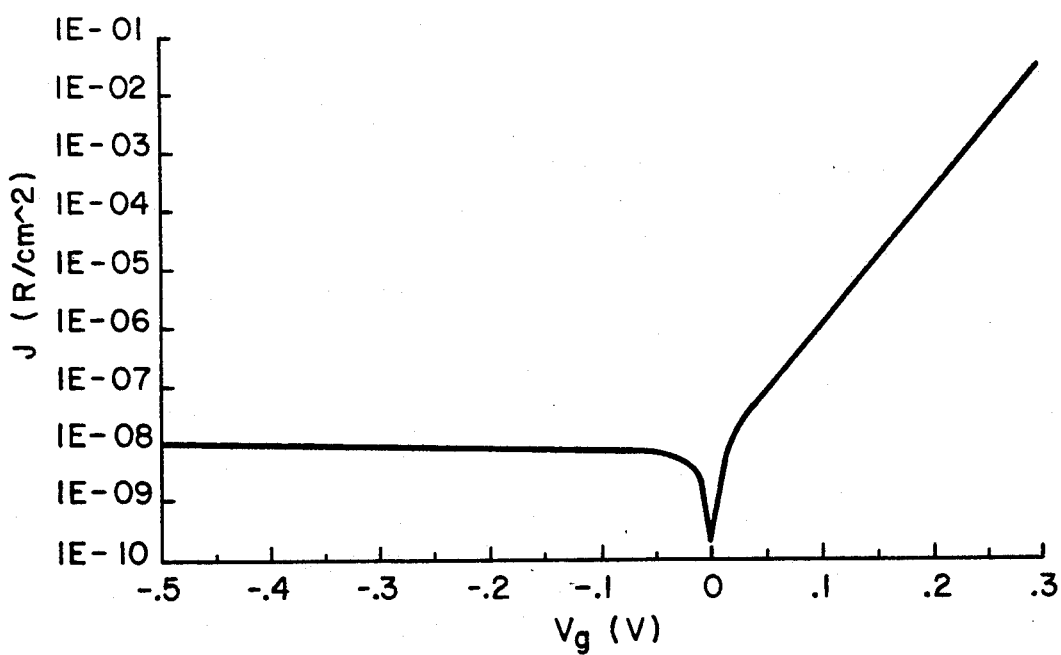
Figure 4A:
FIGS. 4a–4d are photographs showing reflected electron beam diffraction images of a Si thin film formed on a wafer, which is processed by the apparatus of the present invention.
Figure 4B:
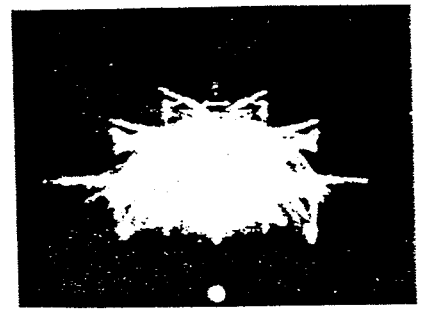
Figure 4C:
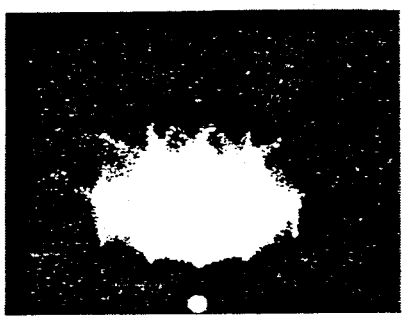
Figure 4D:
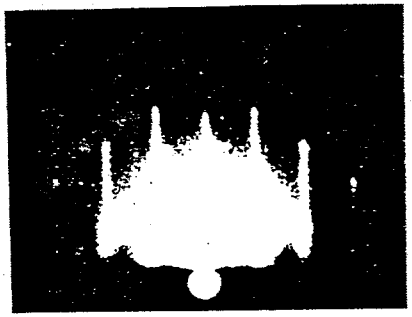

FIG. 3(a) shows the results at normal temperature, and FIG. 3(b) the results at $-50°$ C. The n-value obtained from the linear portion of the characteristics in the normal direction was 1.03 to 1.05, i.e. very close to 1, regardless of the bias condition of wafer, and this means that ideal diode characteristics have been obtained.

The height of the Schottky barrier obtained from these characteristics was approximately 0.58V, which has been reported in the past, and there was almost no change when the energy of argon ions for the surface treatment was changed within the range of 2 to 30 eV. However, in the sample in which a Cu thin film was directly formed without surface treatment by the apparatus of FIG. 1, the n-value was more than 1.2 to 1.3, e.g. 1.8 to 2.5, and this was far from the ideal characteristics. The height of the Schottky barrier obtained from the characteristics also varied widely, and a constant value was not obtained.

To prepare this sample, the Cu thin film was formed at normal temperature. The highest temperature in a thermal process after the formation of the Cu thin film was 130° C. for post-baking of resist during patterning. The fact that the ideal Schottky characteristics could be obtained at low temperature close to normal temperature reveals the effectiveness of the process of reduced pressure surface treatment provided by the apparatus of this invention. In other words, it is possible by the apparatus of this invention to obtain an ideal metal-semiconductor contact without any heat treatment process.

In the past, there have been difficulties in using Cu as a wiring material because it has a poor adhesion property with $SiO_2$. In the surface treatment by the apparatus of this invention, a good adhesion property was obtained between Cu wiring 204 and $SiO_2$ film 202 in the sample (FIG. 2). Namely, even when the surface treatment condition was changed from 2 eV to 30 eV (kinetic energy of argon ions), no detachment occurred in the adhesion property test using adhesive tape, including Scotch ® tape. This is because the adsorbed molecule layer, particularly, adsorbed water on the surface of $SiO_2$, was effectively removed by this invention, and this has made it possible to use Cu having a resistance lower by about one-half than that of aluminum for practical application as LSI wiring.

FIG. 4 shows reflected electron beam diffraction images of Si thin films formed on a (100) Si wafer. To prepare the specimen, (100) Si was processed by pretreatment with acid. Then, it was placed into the apparatus of this invention and surface treatment was performed. Next, a Si thin film of about 0.5 μm was formed by sputtering without exposing the Wafer to atmospheric air. In this case, the wafer temperature was 330° to 350° C., and the film was formed by bombarding argon ions having kinetic energy of about 10 eV on the wafer surface during sputtering. Four photographs, FIGS. 4 (a) to (d), show the electron beam diffraction patterns, representing the results when the energy of argon ions impinged on the Si wafer surface was changed to 10 eV, 15 eV, 30 eV and 40 eV, respectively.

It is evident from these photographs that when the kinetic energy was 10 to 30 eV, single crystal silicon with a clear Kikuchi line was formed. When the kinetic energy exceeds 30 eV and reaches 40 eV, for example, the Kikuchi line disappears, and a diffraction image with a partial ring pattern is seen.

This is because the kinetic energy for surface treatment was too great and the substrate was damaged, decreasing the quality of the epitaxial film. Therefore, it appears that optimal treatment energy is within the range of 0 to 30 eV. When n-type Si with an impurity concentration (phosphorus) of $3 \times 10^{18}$ cm$^{-3}$ was used, the active impurity concentration of Si single crystal grown at a wafer temperature of 330° to 350° C. was $3 \times 10^{17}$ cm$^{-3}$.

Figure 5:
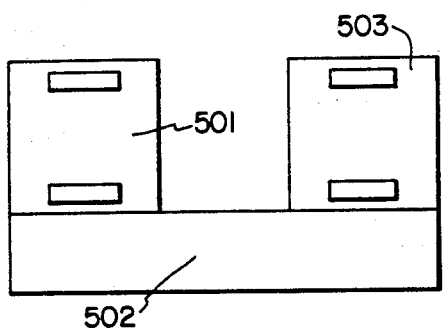
FIGS. 5 and 6 are schematic illustrations showing examples of the apparatus according to the present invention.

The processes as described above, i.e. the formation of Cu thin film, the formation of Si thin film, etc. have been performed by transporting wafers to the sputtering chamber 503 connected by the load lock transport mechanism 502 after surface treatment by the apparatus 501 of this invention (FIG. 5).

However, in the FIG. 1 apparatus, film formation may be performed after surface treatment in the same vacuum chamber 101. $Al_2O_3$ may be used as the target 118, and wafer surface treatment is performed by RF power supply 113b of 220 MHz, and the target may be changed by using a load lock mechanism. Cu may be held by the target holder 117 as a target. In this case, it is desirable to set the frequency of 113b at a lower value than 113a, e.g. 13.56 MHz, in order to increase the sputtering speed.

Alternatively, Cu may be used from the beginning as the target 118, and surface treatment of wafer 108 may be performed under conditions such as not to cause Cu sputtering, using a power supply 113b of 200 MHz, and the Cu film may be formed by changing the target frequency ($f_T$) to 13.56 MHz. This is a very effective method because there is no need to transport the wafer or to change the target.

Figure 6:
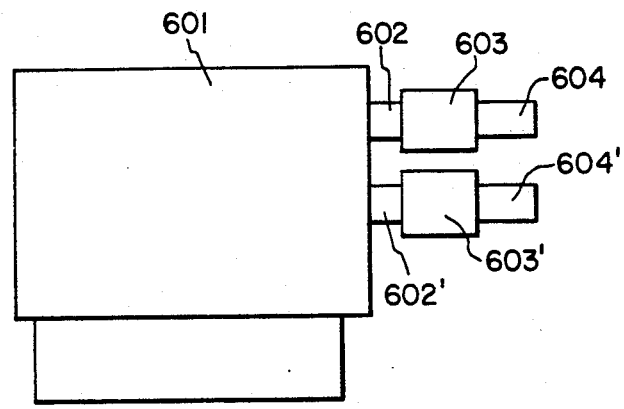
Figure 7:
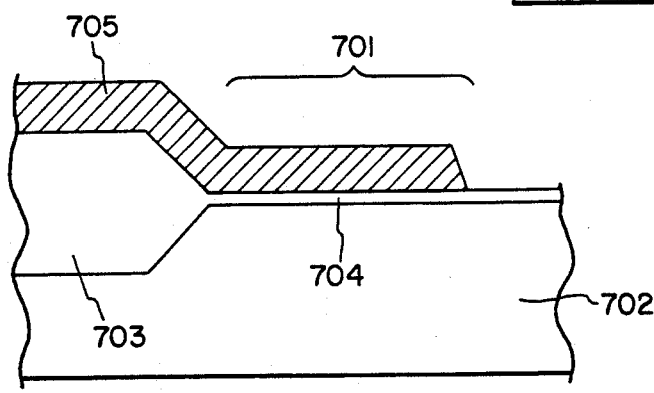
FIGS. 7 and 8 are schematic drawings of thin film structures formed by conventional techniques.
Figure 8:
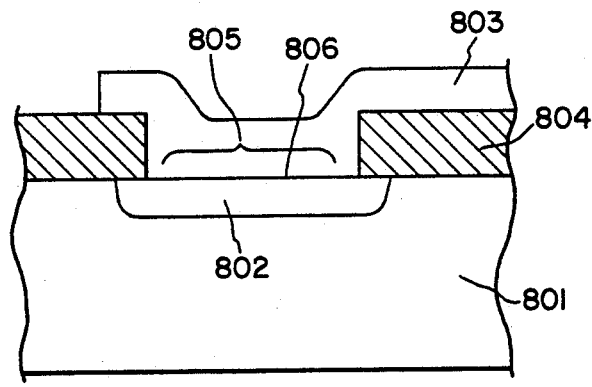

The apparatus of this invention can be connected not only with sputter type film forming apparatus but also with any other type of semiconductor manufacturing equipment. FIG. 6 shows such an example, in which the reduced pressure surface treatment equipment of this invention is connected to the ends of quartz tubes 602 and 602' of a 2-stage LPCVD apparatus.

After the wafer is placed in the wafer load chambers 604 and 604', it is sent to the units 603 and 603' of this invention by the load lock mechanism. After subsequent surface treatment processes, the wafer is brought into LPCVD apparatus 601, and Si or W is grown. For example, when a wafer processed by this treatment was further processed by Si CVD at 600° to 700° C. using $SiH_4$, Si was not deposited on $SiO_2$, and Si grew only on the exposed Si surface. Single crystal Si grew with selective epitaxial growth with good reproducibility.

In contrast to this, in the sample for which surface treatment by the apparatus of this invention was not performed, the results were entirely different, i.e. Si growth was seen on $Sio_2$ and polycrystal silicon grew on Si. This reveals the effectiveness of the invention. In the selective growing process of W by a CVD method using $WF_6$, very good selectivity was obtained by using the apparatus of this invention. Namely, when W of 1 μm thickness was grown, no growth of W was seen on $SiO_2$. The growth on $SiO_2$ in the past, even if only slightly, was due to the contamination of $SiO_2$ surface, particularly due to the generation of nuclei by an adsorbed water layer. The present invention makes it possible to effectively eliminate this and to provide good selective deposition.

In addition, the present equipment may be connected to CVD equipment at normal pressure, thermal oxidation furnace, etc. In any case, it is important to proceed to the next process without exposing the workpiece to atmospheric air after the treatment by this apparatus.

FIG. 1 shows an embodiment of this invention; however, the arrangement may be different from the one shown in the figure. For example, the target and the wafer may be vertically reversed, or they may be placed face-to-face in a vertical position. Even when an electrostatic chuck is not used to hold the target or wafer, there is no deviation from the primary aim of this invention. In the above embodiment, argon gas is used, while hydrogen may also be used. Or, a mixture of argon and hydrogen may be used. When hydrogen is used, free carbon atoms adsorbed on the surface also can be effectively removed in addition to natural oxide films. For example, by mixing 1 to 30% hydrogen in argon, free carbon, hydrocarbons, etc. are removed as $CH_4$ and $H_2O$. However, special care must be taken with regard to following two points: First, the exhaust pump. As the exhaust pump, a cryo-pump with small displacement cannot be used with hydrogen. If a turbo pump is used, the hydrogen exhaust speed is lower than the exhaust speed of other gases by about one order of magnitude. Thus, it is necessary to decrease the flow rate of hydrogen to 1/10 compared with the case of a normal mixture. Secondly, if hydrogen remains in argon, hydrogen is adsorbed on the Si surface, and it is preferable to shut off the hydrogen immediately before film formation. When the film forming atmosphere is sufficiently clean, the film may be formed even when hydrogen flows. In addition, gases such as He, Ne, Kr, etc. may be used.

Further, description has been given of the application of the invention to semiconductor manufacturing processes, whereas it goes without saying that it is also applicable to other processes. For example, when magnetic material or a metal thin film is formed in the manufacture of a magnetic disk or laser disk, surface treatment may be performed by this equipment. In so doing, a film with good adhesive property can be obtained in the case of magnetic disk, and a laser disk with good surface flatness and no bit error for data writing and reading can be attained.

In order to further improve the adhesive property between thin films and to obtain better crystal properties of thin films and bonding surfaces of better quality, it is desirable not to bring wafers into contact with the air in a clean room. Even the air in a clean room contains 1 to 2% moisture, as only dust is removed. Hydrocarbon impurities are also present in the order of several ppm to several hundred ppb. The exposure of the wafer to the air means the adsorption of contaminants such as hydrocarbons, in addition to moisture. To reduce the adsorption of contaminants, it is desirable to transport wafers through a tunnel where high purity $N_2$ continuously flows and not to transport them in the air. Wafers may be continuously transported through this clean nitrogen gas tunnel one by one, or they may be transported by placing 25 pieces each on a wafer carrier. If the clean nitrogen gas tunnel is provided with a cover made of transparent material, e.g. transparent macromolecular material or tempered glass, the position and the movement of the wafers can be easily monitored. The clean nitrogen gas tunnel must have air tightness so that the purity of the nitrogen gas can be maintained and leakage does not occur.

It is indispensable for future high-performance manufacturing techniques to transport wafers between the units through such clean nitrogen gas tunnels and to provide the reduced pressure surface treatment apparatus of this invention within the system.

In the above description, a Si wafer was used as an example specimen, while the equipment of this invention can also be applied to semiconductor wafers or other materials including compound semiconductors.

Applicability for Industry

By this invention, it is possible to provide laminated thin film structures of various types with high reliability and characteristics to be used for high density integrated circuits. As a result, integrated circuits with high reliability and high degree of integration can be produced.

What we claim is:

1. An apparatus for surface treatment by ions, comprising:
    at least one vacuum chamber, an exhaust unit and a gas supply unit connected to said vacuum chamber, a specimen holder for holding a specimen inside said vacuum chamber, a target holder for holding a target inside said vacuum chamber, means for supplying a first electric power of high frequency ($f_t$) of 150 MHz or greater to said target;
    and means for supplying a second electric power of high frequency ($f_w$) lower than said first electric power of high frequency ($f_t$) to said specimen holder.

2. The apparatus according to claim 1, wherein said second electric power of high frequency ($f_w$) is 100 MHz or greater.

3. The apparatus according to claim 1, further comprising a film forming chamber connected to said vacuum chamber so as to transport said specimen without exposing said specimen to atmospheric air between said vacuum chamber and said film forming chamber.

* * * * *